United States Patent
Chang

(10) Patent No.: US 8,664,619 B2
(45) Date of Patent: Mar. 4, 2014

(54) HYBRID ELECTROSTATIC LENS FOR IMPROVED BEAM TRANSMISSION

(71) Applicant: Varian Semiconductor Equipment Associates, Inc., Gloucester, MA (US)

(72) Inventor: Shengwu Chang, South Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/801,713

(22) Filed: Mar. 13, 2013

(65) Prior Publication Data

US 2013/0256526 A1 Oct. 3, 2013

Related U.S. Application Data

(60) Provisional application No. 61/617,738, filed on Mar. 30, 2012.

(51) Int. Cl.
*H01J 3/18* (2006.01)
*H01J 37/12* (2006.01)
*H01J 49/06* (2006.01)

(52) U.S. Cl.
USPC ............ 250/396 R; 250/492.21; 250/492.3; 250/295; 313/361.1

(58) Field of Classification Search
USPC ................ 250/396 R, 492.21, 492.3, 295; 313/361.1
See application file for complete search history.

(56) References Cited

U.S. PATENT DOCUMENTS

| 5,036,258 A | 7/1991 | Chen et al. |
| 2010/0084576 A1* | 4/2010 | Vanderberg ............... 250/492.3 |
| 2011/0079731 A1 | 4/2011 | Kim |
| 2012/0223244 A1* | 9/2012 | Welkie ................. 250/396 ML |
| 2013/0256527 A1* | 10/2013 | Chang ........................ 250/295 |

FOREIGN PATENT DOCUMENTS

WO 2001/060133 A1 8/2001

OTHER PUBLICATIONS

Oh, et al., "Optimization of electrostatic lens systems for low-energy scanning microcolumn applications," J. Vacuum Science and Technology, Part A, vol. 26, No. 6, Oct. 30, 2008.
International Search Report, dated May 7, 2013 for corresponding International Patent Application No. PCT/US2013/031755.

* cited by examiner

*Primary Examiner* — Nikita Wells

(57) ABSTRACT

A hybrid electrostatic lens is used to shape and focus an ion beam. The hybrid electrostatic lens comprises an Einzel lens defined by an elongated tube having a first and second ends and a first electrode disposed at the first end and a second electrode disposed at the second end. The elongated tube is configured to receive a voltage bias to create an electric field within the Einzel lens as the ion beam travels through the hybrid electrostatic lens. The hybrid electrostatic lens further includes a quadrupole lens having a first stage and a second stage, where each of the stages is defined by a plurality of electrodes turned 90° with respect to each other to define a pathway in the Z direction through the elongated tube. The Einzel lens focuses the ion beam and the quadrupole lens shapes the ion beam.

19 Claims, 6 Drawing Sheets

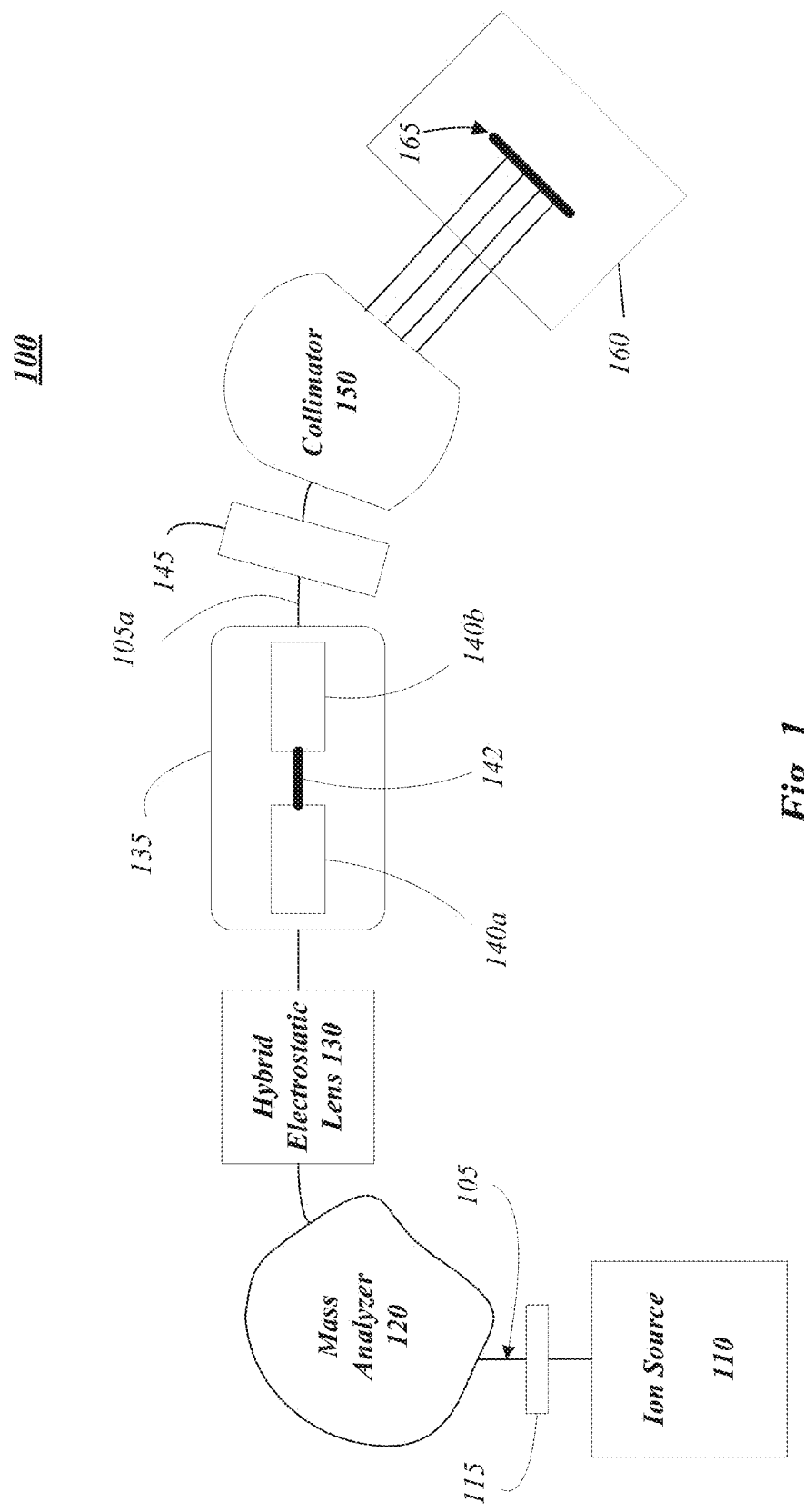

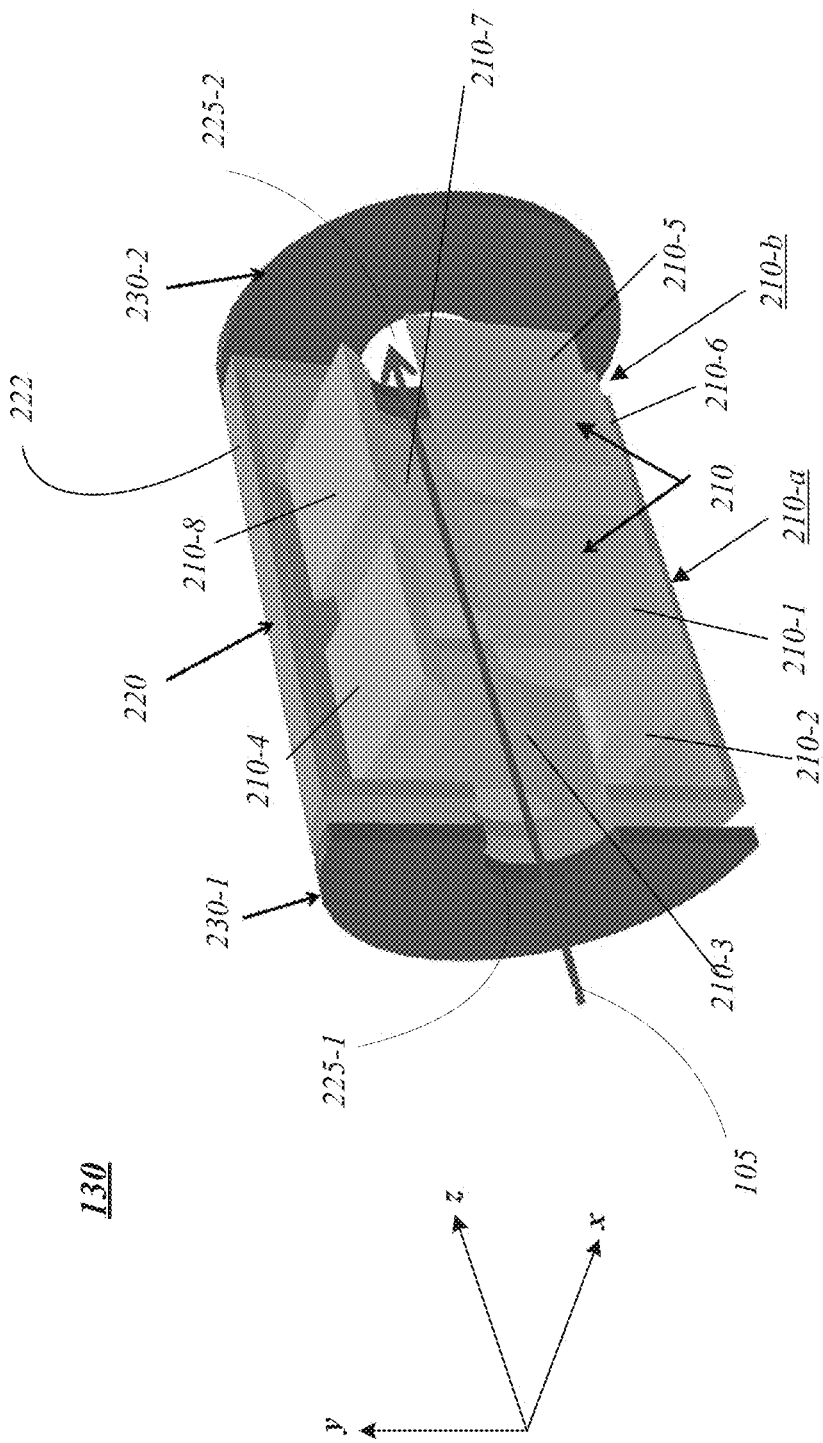

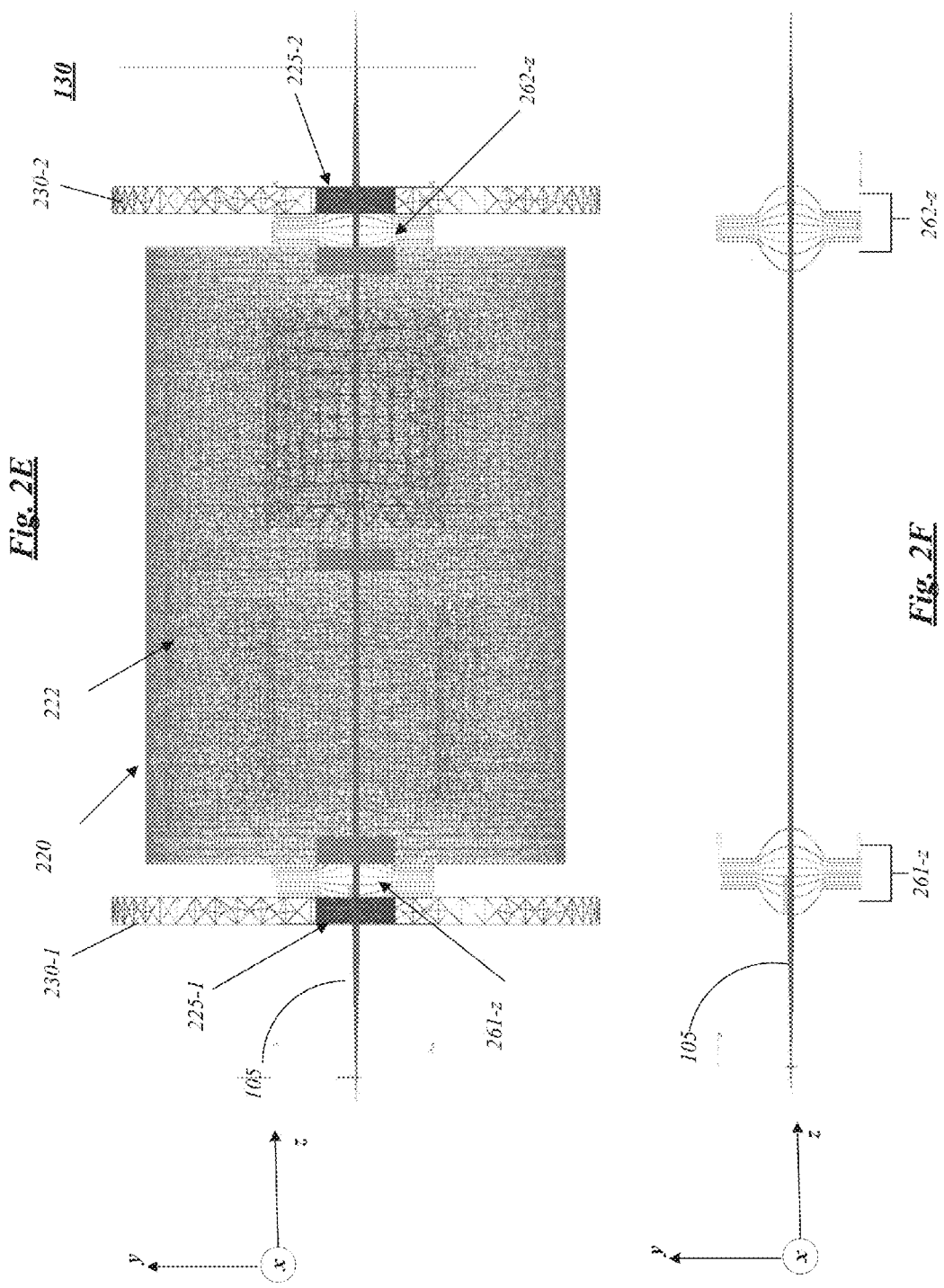

US 8,664,619 B2

HYBRID ELECTROSTATIC LENS FOR IMPROVED BEAM TRANSMISSION

RELATED APPLICATION

This application claims priority to the commonly-owned U.S. provisional patent application Ser. No. 61/617,738 filed Mar. 30, 2012, and entitled "Hybrid Electrostatic Lens for Improved Beam Transmission."

FIELD

Embodiments of the invention relate to the field of ion implantation for forming semiconductor structures. More particularly, the present invention relates to a hybrid electrostatic lens for use in high energy ion implantation systems.

BACKGROUND

Ion implantation is a standard technique for introducing property-altering impurities into substrates. A desired impurity material is ionized in an ion source, the ions are accelerated to form an ion beam of prescribed energy, and the ion beam is directed at the surface of the substrate. The energetic ions in the beam penetrate into the sub-surface of the substrate material and are embedded into the crystalline lattice to form a region of desired conductivity or material property. Depending on the type of device being fabricated using ion implantation, the impurity ions may need to be implanted at various depths within the crystalline lattice. The depth of implantation is determined by the energy of the ions directed toward the substrate. For example, certain devices require shallow transistor junctions necessitating low energy ion beams for implantation. Conversely, certain devices fabricated for use in power applications, for example, require deeper impurity implantation necessitating a high energy hydrogen ion beam.

For these high energy implantation applications, typically 750 kV or greater, tandem acceleration is often used to generate ions having the required energy. Often tandem acceleration is applied to hydrogen ions in order to generate high energy ions sufficient for deep implants into a substrate. In a typical tandem acceleration process, an electrostatic accelerator accelerates negative hydrogen ions generated in an ion source from ground potential up to a positive high-voltage terminal. The electrons on the negative hydrogen ions are then stripped from the negative ion by passage through a charge exchange region, the stripper. The resulting positive hydrogen ion (proton) is again accelerated as it passes to ground potential from the high positive potential. The protons emerge from the tandem accelerator with twice the energy of the high positive voltage applied to the tandem accelerator. In order to maximize transmission of the accelerated ion beam through the tandem accelerator, the ion beam must be transported through the stripper which is located at the nominal center of the tandem accelerator. An over-focused beam occurs when the beam converges at its focal point at a position along the beam path that does not coincide with the location of the stripper which is the nominal center of the tandem accelerator, namely that the beam is focused before the nominal center of the tandem accelerator. An over-focused beam yields deleterious effects on beam transmission and associated beam current. Accordingly, there is a need for an improved high energy ion implantation system which prevents the transmission loss of the over-focused ion beams supplied to a tandem accelerator to increase beam current. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a hybrid electrostatic lens may include an Einzel lens superimposed on electrostatic lenses used to shape and focus an ion beam traveling therethrough. The Einzel lens is defined by an elongated tube having a first and second ends and a first electrode disposed at the first end and a second electrode disposed at the second end. The first electrode is configured to receive the ion beam and the second electrode is configured to allow the ion beam to exit the hybrid electrostatic lens. The elongated tube is configured to receive a voltage bias to produce an electric field within the Einzel lens to focus the ion beam as the ion beam travels through the hybrid electrostatic lens. The electrostatic lenses are disposed within the elongated tube and are configured to steer and focus the ion beam in an X and Y direction as the beam is transmitted through the electrostatic lenses in a Z direction.

BRIEF DESCRIPTION OF THE DRAWINGS

The accompanying drawings illustrate preferred embodiments of the disclosed method so far devised for the practical application of the principles thereof, and in which:

FIG. 1 is a functional block diagram of an ion implanter;

FIG. 2 depicts an exemplary hybrid electrostatic lens;

FIGS. 2E and 2F illustrate an electric field associated with an ion beam about an entrance and exit of the exemplary hybrid electrostatic lens of FIG. 2;

DETAILED DESCRIPTION

Figure 2A:
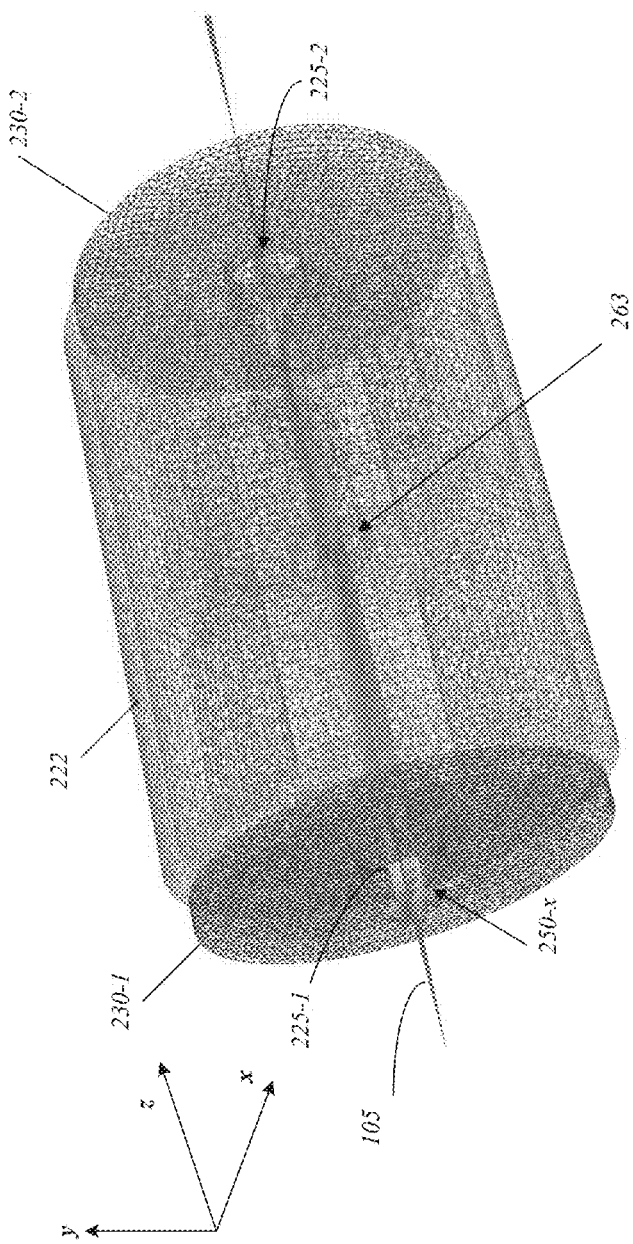
FIGS. 2A and 2B depict an electric field associated with an ion beam about a horizontal plane as it travels through the exemplary hybrid electrostatic lens of FIG. 2.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the problems associated with focusing ion beams injected into a tandem accelerator in high energy implantation applications, a hybrid electrostatic lens is disposed upstream of the accelerator. The hybrid electrostatic lens comprises an Einzel lens superimposed on a quadrupole lens. A first and second electrodes are disposed at the ends of a elongated tube to form the Einzel lens. The quadrupole lens is disposed within the elongated tube of the Einzel lens. The Einzel lens focuses the ion beam and the quadrupole lens steers and shapes the ion beam. The hybrid electrostatic lens focuses the high energy ion beam at both its entrance and exit in order to maintain the beam size relatively small for entrance into the tandem accelerator, along the beam line as well as on the target substrate. By focusing and shaping the high energy ion beam through the use of the hybrid electrostatic lens, beam transmission through the tandem accelerator is improved, thereby improving beam current and consequently throughput of device fabrication.

FIG. 1 is a functional block diagram of an exemplary high energy ion implanter 100. Although the system 100 shown in FIG. 1 has a limited number of elements in a certain topology, it may be appreciated that the system 100 may include more or less elements in alternate topologies as desired for a given implementation. An ion source 110 is configured to generate ions of a particular species based on the introduction of a feed gas having desired dopant characteristics. The ion source 110 may have an indirectly heated cathode (IHC) where a filament is used to heat a cathode that supplies energetic electrons within the ion source. The gas is ionized into a plasma by exposing it to these energetic electrons. Ion beam 105 is extracted from the ion source 110 through an extraction aperture by a biased extraction electrode assembly as is known in the art. A charge exchanger 115 receives the low energy positive ion beam 105 and creates a negative ion beam which is supplied to mass analyzer 120. Beam 105 passes through the mass analyzer 120 that includes a resolving magnet which functions to pass only ions having the desired mass and energy to a resolving aperture. In particular, mass analyzer 120 includes a curved path where beam 105 is exposed to an applied magnetic field such that only the ions with a desired mass and energy are able to travel through the analyzer and those ions having the undesired mass and energy are deflected away from the beam path.

The ion beam 105 is supplied to hybrid electrostatic lens 130. As will be described in more detail below with reference to FIG. 2, the hybrid electrostatic lens 130 includes an Einzel lens configured to house a quadrupole lens. The hybrid lens 130 receives the negative ion beam 105 and focuses the beam at both ends to keep the beam size relatively small for transmission through tandem accelerator 135. To this point, ion beam 105 is considered a low energy ion beam with energy in the range of a few keV to a few tens of keV. Tandem accelerator 135 receives the low energy ion beam 105 and accelerates the beam to energies in the range of several thousand keV (i.e. MeV). Tandem accelerator 135 may include a low energy accelerator tube 140a, a gas filled stripper tube 142, and a high energy accelerator tube 140b. Generally, the accelerator tube contains a number of accelerator electrodes separated by insulating rings. A high positive voltage is applied by a high voltage power supply to the terminal and consequently to the highest voltage electrodes of the low energy and high energy accelerator tubes 140a, 140b. Adjacent accelerator electrodes are interconnected by high value resistors which distribute the applied voltage among the accelerator electrodes. The gas-filled stripper tube 142 is disposed between the accelerator tubes 140a, 140b which converts ions in the beam 105 from a negative charge to a positive charge. In a normal high energy mode, the negative ion beam 105 is injected into the tandem accelerator, accelerated through the low energy accelerator tube 140a and converted to a positive beam 105a in the stripper 142 and then accelerated further in the high energy accelerator tube 140b. The high energy ion beam 105a may be supplied to filter 145 which may be a magnet that effectively filter away the ions with undesired mass or energy from the positive ion beam 105a. The hybrid lens 130 maintains the beam size relatively small as the beam is supplied to the tandem accelerator 135. This relatively small beam size cannot be achieved by simply concatenating a conventional Einzel lens with a conventional quadrupole lens in series. As described in more detail below, simply placing a conventional Einzel lens in series with a conventional quadrupole lens results in a beam size that is much larger at the exit of the quadrupole lens as compared to the beam size at the exit of the hybrid lens 130.

A collimator 150, which includes a collimator magnet, is energized to deflect ion beamlets of beam 105a in accordance with the strength and direction of an applied magnetic field to provide a ribbon beam targeted toward end station 160. The collimator magnet 150 is provided to ensure that the beam 105a is incident on a target substrate supported by platen 165 within end station 160 at a constant angle across the surface of the substrate. The ions lose energy when they collide with electrons and nuclei in the target substrate and come to rest at a desired depth within the substrate based on the acceleration energy. The end station 160 may support one or more substrates on platen 165 in the path of ion beam 105a. The end station 160 may also include additional components known to those skilled in the art. For example, end station 160 may typically include automated handling equipment for introducing target substrates into the ion implanter 100 and for removing such substrates after ion treatment.

FIG. 2 illustrates a cut-away perspective view of the exemplary hybrid electrostatic lens 130 which includes a quadrupole lens 210 housed within an Einzel lens 220. Generally, the quadrupole lens is used to steer and shape the ion beam 105 and the Einzel lens 220 is used to focus the ion beam. The quadrupole lens 210 comprises eight electrodes 210-1 . . . 210-8 which defines a pathway in the z direction through which ion beam 105 is transmitted. Four electrodes 210-1, 210-2, 210-3 and 210-4 are turned 90° with respect to each other and defines a first stage 210-a of the quadrupole lens 210 and electrodes 210-5, 210-6, 210-7 and 210-8 are turned 90° with respect to each other and defines a second stage 210-b of the quadrupole lens 210. Each electrode 210-1 . . . 210-8 may be made from graphite, or aluminum, for example. In the first stage 210-a of quadrupole lens 210, the electrodes 210-1 and 210-3 are biased with a positive voltage and electrodes 210-2 and 210-4 are biased with a negative voltage. In the second stage 210-b of quadrupole lens 210, electrodes 210-5 and 210-7 are biased with a negative voltage and electrodes 210-6 and 210-8 are biased with a positive voltage. For example, the electrodes 210-1 and 210-3 in the first stage 210-a and the electrodes 210-6 and 2210-8 may be biased with a positive voltage in the range of approximately 0 to +20 kV and the electrodes 210-2 and 210-4 in the first stage 210-a and the electrodes 210-5 and 210-7 in the second stage 210-b may be biased with a negative voltage in the range of approximately 0 to −20 kV. These exemplary voltage biases are in the instance of a negative ion beam 105. By biasing the various electrodes 210-1 . . . 210-8, the quadrupole lens 210 steers the beam 105 up and down vertically in the y direction as well left and right horizontally in the x direction and adjusts the focusing of the beam 105 in the x and y directions to control the beam shape as the beam travels in the z direction. For purposes of this disclosure, references to the x or y direction and/or the xy plane represent orthogonal directions with respect to the direction of travel of the ion beam 105 in a z direction which direction may vary as the beam travels between the ion source 110 and end station 160.

The Einzel lens 220 of hybrid electrostatic lens 130 is defined by an elongated cylindrical (or generally rectangular) tube 222 having a longitudinal axis in the z direction, and a first ground electrode 230-1 and a second ground electrode 230-2. Ground electrode 230-1 includes aperture 225-1 through which beam 105 enters the hybrid electrostatic lens 130 and second ground electrode 230-2 includes aperture 225-2 from which beam 105 exits hybrid electrostatic lens 130. The Einzel lens 220 is a charged particle lens that focuses the ion beam 105 without changing the energy of the beam. The tube 222 which may also be referred to herein as the electrostatic lens electrode, may be made from graphite, aluminum or other appropriate conducting material that, when biased with a particular voltage, generates a desired electric field in the path of the ion beam 105. The tube 222 may be powered with a positive or negative voltage bias. In particular, a positive voltage may be applied to the tube or electrostatic lens electrode 222 for a negative ion beam 105 and a negative voltage may be applied to the tube or electrostatic lens electrode 222 for a positive ion beam 105. The electrodes 230-1 and 230-2 of the Einzel lens may be maintained at ground. The longitudinal dimension in the z direction of tube 222 of the Einzel lens 220 disclosed herein may be approximately 200 mm and is configured to house quadrupole lens 210. In contrast, a typical Einzel lens may have a longitudinal dimension in the z direction of only about 10 mm, for example, and does not house a quadrupole lens. The electrodes 230-1 and 230-2 of the Einzel lens may be maintained at ground.

The quadrupole lens 210 is housed within tube 222 and as mentioned above is used to steer and shape the ion beam 105 within the tube 222 while the Einzel lens 220 focuses the ion beam. This focusing and shaping of the beam 105 results in a desired beam size and shape as the beam is transmitted through the hybrid electrostatic lens 130. In this manner, the hybrid electrostatic lens 130 utilizes the Einzel lens 220 to focus beam 105 to the desired beam size and shape and the quadrupole lens 210 is used to steer the beam 105 to tandem accelerator 135 such that the beam is not over-focused during transmission through the accelerator which improves beam transmission within ion implanter 100.

Figure 2B:
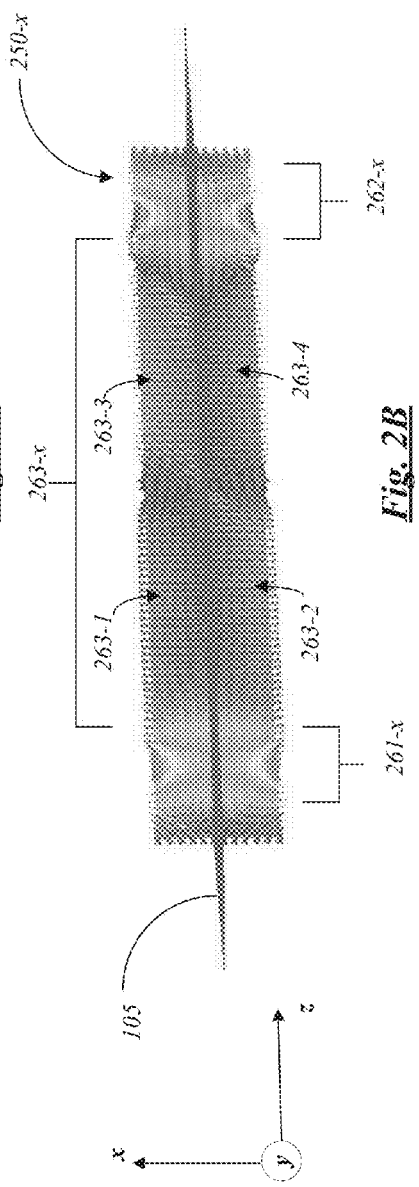

FIGS. 2A and 2B illustrate the electric field about the horizontal plane (x-direction) associated with the ion beam 105 as it travels through the hybrid electrostatic lens 130 (shown in shadow) in the z direction. In particular, beam 105 is illustrated as a negative ion beam which enters the hybrid electrostatic lens 130 at entrance aperture 225-1 of ground electrode 230-1 of the Einzel lens 220. The tube 222 is biased with a positive voltage and the beam 105 exits the hybrid electrostatic lens 130 at exit aperture 225-2 of ground electrode 230-2 of Einzel lens 220. If the ion beam 105 is a positive ion beam, then the tube 222 is biased with a negative voltage. For ease of explanation, the hybrid electrostatic lens 130 is described herein with reference to a negative ion beam, but it should be understood that the lens may be utilized with a positive ion beam.

The induced horizontal electric field on the beam 105, shown generally at 250-x, focuses and shapes the beam as it travels through the hybrid electrostatic lens. In particular, FIG. 2B illustrates a top plan view of the horizontal plane of the electric field associated with the ion beam 105. In other words, the horizontal plane is equivalent to the x direction shown in FIG. 2A. The electric field at region 261-x corresponds to the horizontal electric field proximate the entrance aperture 225-1 of ground electrode 230-1 of Einzel lens 220. Similarly, the electric field at region 262-x corresponds to the horizontal electric field proximate the exit aperture 225-2 of ground electrode 230-2 of the Einzel lens 220. The Einzel lens 220, defined by tube 222 and ground electrodes 230-1 and 230-2, focuses the ion beam 105 at the entrance and exit, respectively, of the hybrid electrostatic lens 130. In particular, the electric field at region 263-x corresponds to the horizontal electric field proximate the quadrupole lens 210 in response to the voltage applied to the electrodes that define stages 210-a and 210-b. The directions of the arrows that define the exemplary horizontal electric field 250-x correspond to the direction of the electric field applied to the beam 105 in a particular region. For example, regions 263-1 and 263-2 illustrate arrows directed essentially toward the beam 105. This corresponds to a voltage applied to the first stage 210-a of quadrupole lens 210. Similarly, the regions 263-3 and 263-4 illustrate arrows directed away from beam 105. This corresponds to a voltage applied to the second stage 210-b of quadrupole lens 210. In this manner, the quadrupole lens 210 steers and shapes the beam 105 corresponding to the applied voltage and resulting electric fields in the horizontal or x-direction.

Figure 2C:
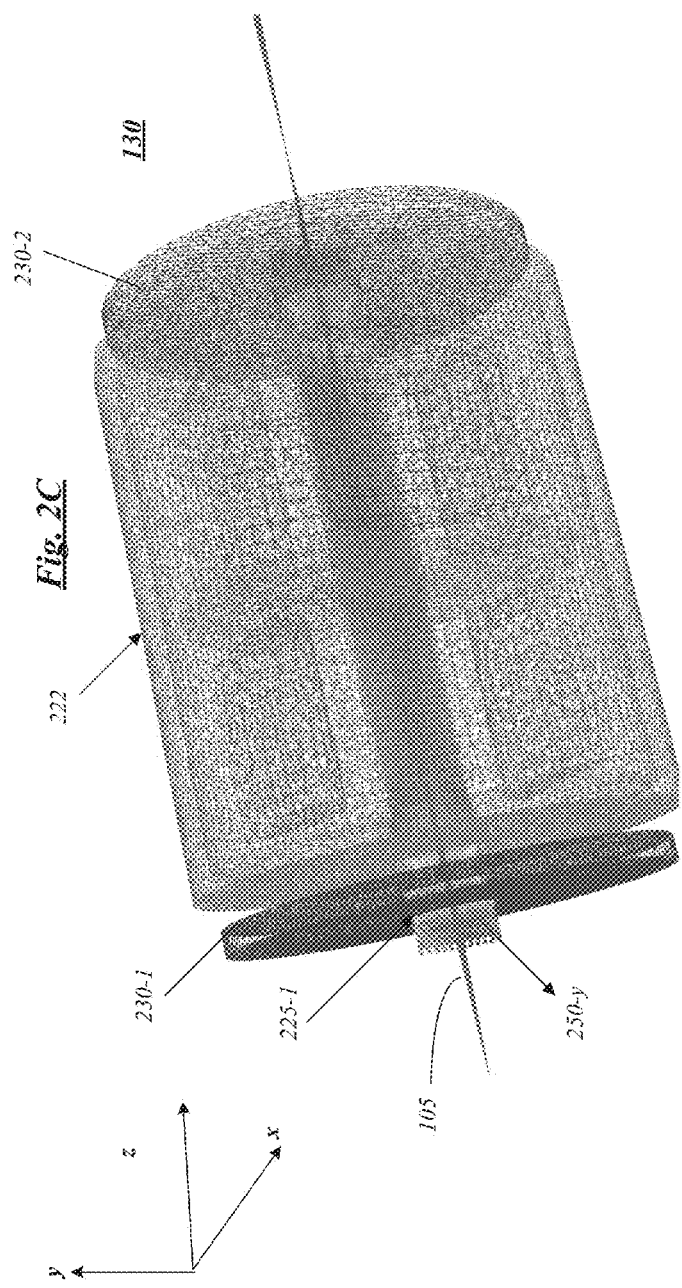
FIGS. 2C and 2D illustrate an electric field associated with an ion beam about a vertical plane as it travels through the exemplary hybrid electrostatic lens of FIG. 2.
Figure 2D:
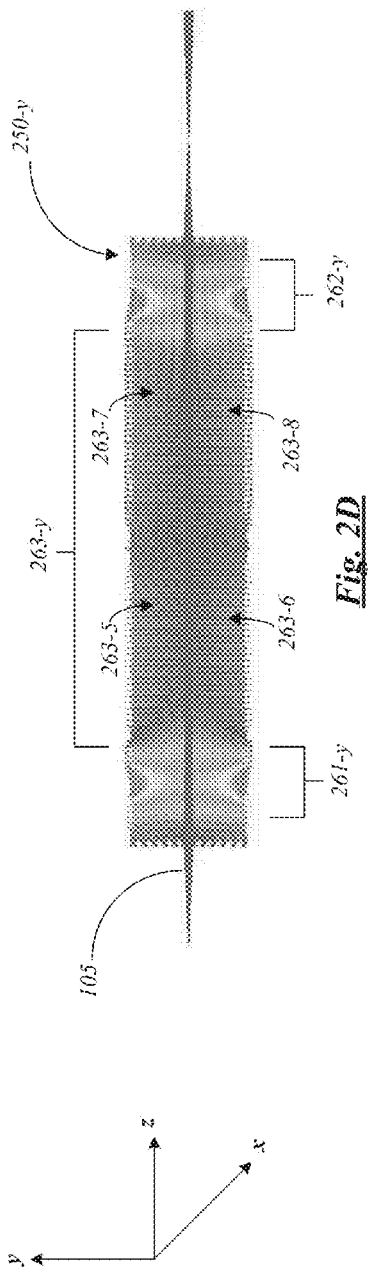

FIGS. 2C and 2D illustrate the electric field about the vertical plane (y-direction) associated with the ion beam 105 as it travels through the hybrid electrostatic lens 130 (shown in shadow) in the z direction. Beam 105 enters the hybrid electrostatic lens 130 at entrance aperture 225-1 of ground electrode 230-1. The tube 222 is biased with a positive voltage with respect to the ground electrodes 230-1, 230-2 and the beam 105 exits the hybrid electrostatic lens 130 at exit aperture 225-2 of ground electrode 230-2. The induced vertical electric field on the beam 105, shown generally at 250-y, focuses the beam as it travels through the hybrid electrostatic lens. In particular, FIG. 2D illustrates a plan view of the vertical plane of the electric field 250-y associated with the ion beam 105 induced by the hybrid electrostatic lens 130. The electric field at region 261-y corresponds to the vertical electric field proximate the entrance aperture 225-1 of ground electrode 230-1 of Einzel lens 220. Similarly, the electric field at region 262-y corresponds to the vertical electric field proximate the exit aperture 225-2 of ground electrode 230-2 of Einzel lens 220. The Einzel lens 220, defined by tube 222 and ground electrodes 230-1 and 230-2, focuses the ion beam 105 at the entrance and exit, respectively, of the hybrid electrostatic lens 130. The electric field at region 263-y corresponds to the vertical electric field proximate the quadrupole lens 210 in response to the applied voltage to the electrodes that define stages 210-a and 210-b. The directions of the arrows that define the exemplary vertical electric field 250-y correspond to the direction of the electric field applied to the beam 105 in a particular region of the quadrupole lens 210. For example, regions 263-5 and 263-6 illustrate arrows directed essentially away from the beam 105. This corresponds to a voltage applied to the first stage 210-a of quadrupole lens 210. Similarly, the regions 263-7 and 263-8 illustrate arrows directed toward the beam 105. This corresponds to a voltage applied to the second stage 210-b of quadrupole lens 210. Thus, the electric field generated at the first stage 210-a of the quadrupole lens 210 forces or squeezes the beam 105 vertically (y-direction) and stretches the beam horizontally (x-direction) whereas the electric field generated at the second stage 210-b of the quadrupole lens 210 forces or squeezes the ion beam 105 horizontally (x-direction) and stretches the beam vertically (y-direction). In this manner, the quadrupole lens 210 steers and shapes the beam 105 corresponding to the applied voltage and resulting electric fields as the beam travels in the z-direction through the electrostatic lens 130.

FIGS. 2E and 2F illustrate a portion of the electric field imparted on beam 105 as it travels through the hybrid electrostatic lens 130. In particular, beam 105 enters the hybrid electrostatic lens 130 at entrance aperture 225-1 of ground electrode 230-1. An electric field is imparted on the beam 105 in the entrance region of Einzel lens defined by tube 222 and first ground electrode 230-1 about the entrance aperture 225-1. As previously described, the tube 222 is biased with a positive voltage for a negative ion beam 105 which exits the hybrid electrostatic lens 130 at exit aperture 225-2 of ground electrode 230-2. An electric field is imparted on the beam 105 in the exit region of Einzel lens defined by tube 222 and second ground electrode 230-2 about the exit aperture 225-2. FIG. 2F illustrates a side view of the electric fields 261-z and 262-z imparted on the ion beam 105 as it travels through the hybrid electrostatic lens 130 in the z direction from entrance aperture 225-1 to exit aperture 225-2. The electric fields 261-z and 262-z illustrate the equal potential lines at the entrance and exit the hybrid electrostatic lens 130, respectively. The relatively equal potential lines that define electric field 261-z illustrates that ion beam 105 is focused as it enters the first stage 210-a and second stage 201-b of quadrupole lens 210 where it is shaped and steered. The relatively equal potential lines that define electric field 262-z illustrate that the ion beam 105 is focused after it passes through the quadrupole lens 210 and exits the hybrid electrostatic lens 130 at exit aperture 225-2. In this manner, the quadrupole lens is used to steer and shape the ion beam 105 and the Einzel lens 220 is used to focus the ion beam as it travels through the hybrid electrostatic lens 130.

Figure 3:
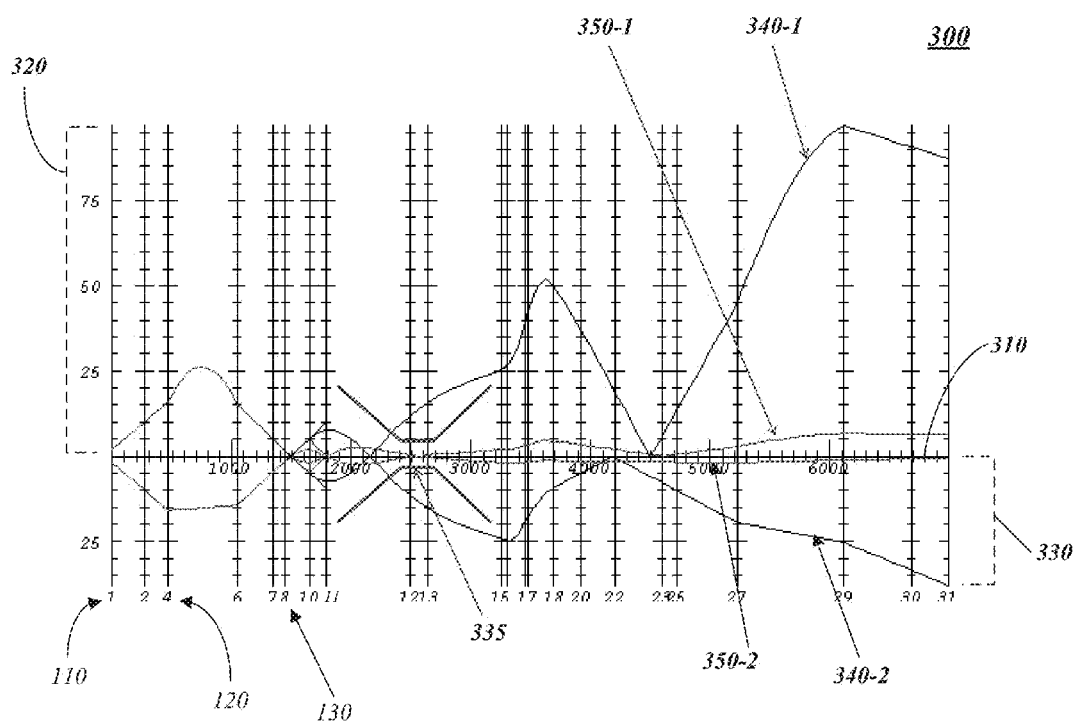
FIG. 3 is a graph of beam optics along a beam path utilizing the hybrid electrostatic lens of FIG. 2 at a given extraction energy.

FIG. 3 illustrates graph 300 of beam optics along a beam path utilizing the hybrid electrostatic lens of FIG. 2 at an exemplary extraction of 7 keV. In particular, the beam envelope of beam 105 is illustrated by graph 300 as the beam propagates from source 110 to a target substrate disposed on platen 165. The horizontal axis 310 of graph 300 represents beam propagation in the z direction. For example, position 1 represents the position of the ion beam 105 at source 110, position 4 represents the position of the ion beam 105 at mass analyzer 120, and so forth as the beam propagates along the beam line to position 31 which represents the target substrate. It should be noted that the aperture of tandem accelerator 135 corresponds to the positions denoted by area 335 and the placement of hybrid electrostatic lens 130 corresponds to position 8. The portion 320 of the vertical axis represents the x dimension of the beam and portion 330 represents the y dimension of the beam. In other words, portion 320 represents the width of beam 105 and portion 330 represents the height of the beam. The x and y dimensions of the beam 105 change as the beam travels from the source at position 1 to the target substrate at position 31 as illustrated by the graphed lines 340-1, 340-2, 350-1 and 350-2 as described in more detail below.

The graphed lines 340-1 and 340-2 illustrate the various positions of the beam (beam envelop) using only a quadrupole lens upstream of a tandem accelerator as in the prior art. In particular, graph line 340-1 illustrates the position of the beam in the x dimension since this graph line falls within portion 320 of the vertical axis and graph line 340-2 illustrates the position of the beam in the y dimension since this graph line falls within portion 330 of the vertical axis. Area 335 denotes the tandem accelerator 135 to which the ion beam 105 is provided from the hybrid electrostatic lens 130. In particular, area 335 denotes the apertures of the accelerator electrodes (not shown) contained in low energy acceleration tube 140a, the aperture of stripper tube 142 and the apertures of the acceleration electrodes in high energy acceleration tube 140b of tandem accelerator 135 shown in FIG. 1. The aperture of the stripper tube 142 is disposed in the middle of the tandem accelerator. In order to transport the ion beam 105 through the tandem accelerator 135, the ion beam has to be focused in such a way that the beam envelop defined by graph lines 340-1 and 340-2 is enclosed inside the aperture of tandem accelerator denoted by area 335. In the other words, the closer the beam is focused to the middle of the entrance aperture of the tandem accelerator 135, more of the beam will be travel through the tandem accelerator. As can be seen, graph 340-1 proximate area 335 illustrates that the ion beam is outside the tandem accelerator aperture denoted by area 335 in the x dimension identified by the displacement of graph 340-1 further away from horizontal axis 310 with respect to the aperture of the tandem accelerator denoted by area 335. It also can be seen that the ion beam is not focused at the middle of the aperture of the tandem accelerator 130. In other words, the ion beam is more focused between positions 11 and 12 which is before the stripper tube 142 located at the center of tandem accelerator 135 rather than at the middle of the aperture of the tandem accelerator to promote improved beam transmission through the accelerator. This is referred to as being "over-focused" since the beam is focused before or prior to reaching the center of the aperture of tandem accelerator 135. Graph 340-2 proximate area 335 also illustrates that the ion beam is not within the tandem accelerator aperture denoted by the area 335 in the y dimension since graph 340-2 is displaced further away from horizontal axis 310 in portion 330 of graph 300 with respect to the aperture of the tandem accelerator denoted by area 335.

Graphs 350-1 and 350-2 illustrate the various positions of the beam 105 using the hybrid electrostatic lens 130 shown in FIG. 2. Graph line 350-1 illustrates the position of the beam 105 in the x dimension since this graph line falls within portion 320 of the vertical axis and graph line 350-2 illustrates the position of the beam in the y dimension since this graph line falls within portion 330 of the vertical axis. As can be seen, graph 350-1 proximate area 335 illustrates that the ion beam is focused in the x dimension at the middle of the aperture of tandem accelerator 135 and the portion of graph line 350-1 proximate area 335 is closer to the horizontal axis 310 with respect to the aperture of the tandem accelerator denoted by area 335. This means that the beam 105 is within the aperture of the tandem accelerator 135 denoted by area 335 in the x dimension. In other words, the x dimension of beam 105 travels through tandem accelerator 135. Similarly, graph 350-2 proximate area 335 illustrates that the ion beam is focused in the y dimension at the middle of the aperture of tandem accelerator 135 and the portion of graph line 350-2 proximate area 335 is closer to the horizontal axis 310 with respect to the aperture of the tandem accelerator denoted by the area 335. This means that the beam is enclosed within the aperture of tandem accelerator 135 denoted by area 335 in the y dimension. In the other words, the y dimension of beam 105 travels through tandem accelerator 135. As can be seen, the hybrid electrostatic lens 130, disposed before the tandem accelerator 135 along the beam line, focuses the ion beam 105 proximate the middle of the aperture of the tandem accelerator. This reduces beam size as the beam 105 travels through tandem accelerator 135 and improves beam transmission therethrough.

As can generally be seen, after the beam 105 propagates through the hybrid electrostatic lens 130 represented by position 8 in graph 300, the envelope of beam 105 defined by graph lines 350-1 and 350-2 remains smaller (i.e. closer to horizontal axis 310) as it propagates to position 31 (i.e. target substrate) as compared to prior beam line optics represented by graphs 340-1 and 340-2. Experimental exemplary data has shown that for a 7 to 8 keV negative proton beam (e.g. beam 105) only utilizing a low energy quadrupole lens having beam propagation as represented by graphs 340-1 and 340-2, the beam will be over-focused when it reaches the aperture of the tandem accelerator 135 resulting in beam transmission through the tandem accelerator of only 10% at 1.5 MeV. Conversely, exemplary data has shown that for a 7 to 8 keV negative proton beam (e.g. beam 105) utilizing hybrid electrostatic lens 130 having beam propagation represented by graphs 350-1 and 350-2, the beam will be focused when it reaches the aperture of the tandem accelerator 135 resulting in beam transmission through the tandem accelerator of 100% at 1.5 MeV.

The hybrid electrostatic lens 130, disposed before the tandem accelerator 135 along the beam line in the z direction, focuses the ion beam 105 proximate the aperture of the tandem accelerator. This improves beam transmission through tandem accelerator 135 as well as improving beam utilization incident on a target substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

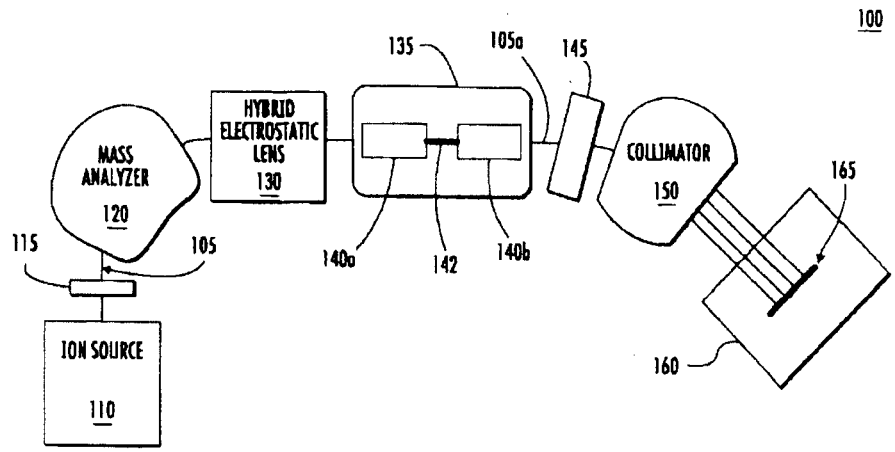

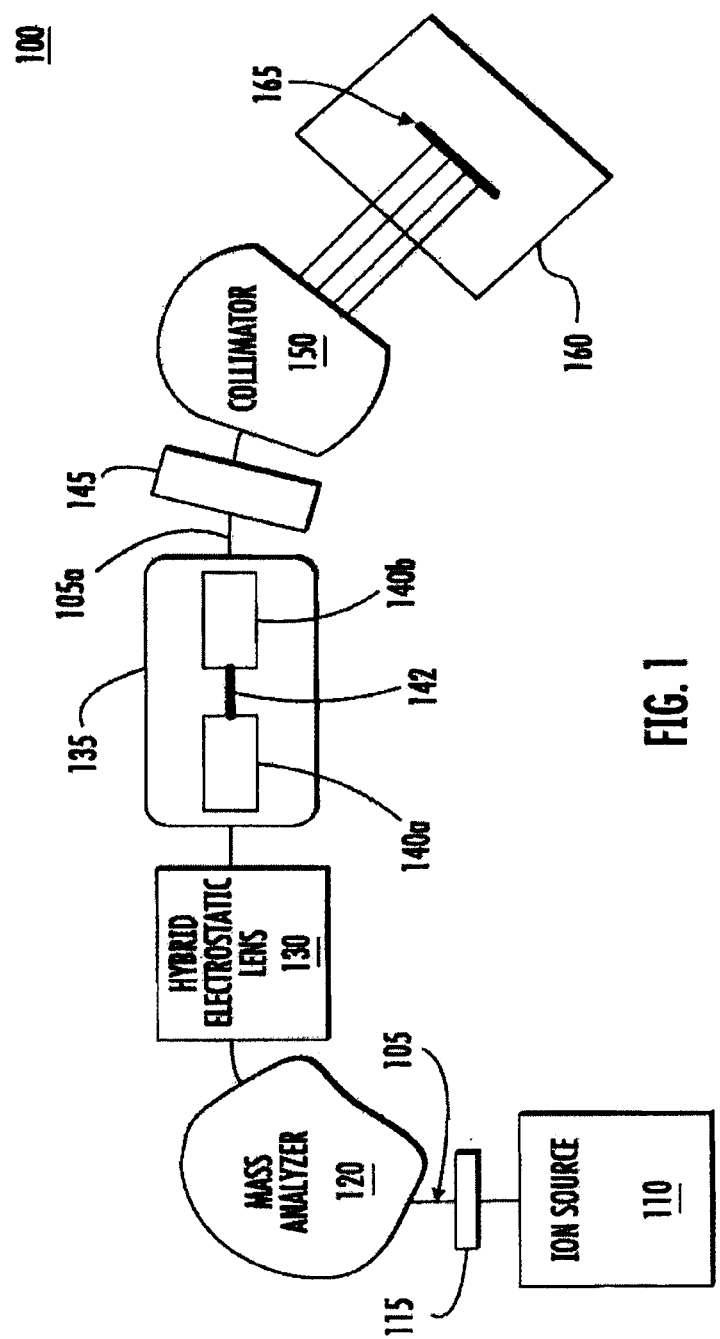

What is claimed is:

1. A hybrid electrostatic lens comprising:
    an Einzel lens defined by an elongated tube having a first and second ends and a first electrode disposed at the first end and a second electrode disposed at the second end, the elongated tube being configured to receive a voltage bias to generate an electric field for focusing an ion beam therein; wherein the electrostatic lens is a quadrupole lens having a first stage defined by four quadrupole lenses turned 90° with respect to each other to define a pathway in the Z direction through the elongated tube; and
    electrostatic lenses disposed within the elongated tube of the Einzel lens, the electrostatic lenses configured to adjust focusing of the ion beam in an X direction and a Y direction orthogonal to the X direction as the beam is transmitted through the electrostatic lenses in a Z direction which is orthogonal to a plane defined by the X direction and the Y direction.

2. The hybrid electrostatic lens of claim 1 further comprising a second stage downstream of the first stage along the z direction wherein the second stage is defined by four quadrupole lenses turned 90° with respect to each other to further define the pathway in the Z direction through the elongated tube.

3. The hybrid electrostatic lens of claim 1 wherein the electrostatic lenses is a quadrupole lens having a first stage and a second stage, the first stage comprising a first, second, third and fourth electrodes turned 90° with respect to each other and the second stage comprising a fifth, sixth, seventh and eighth electrodes turned 90° with respect to each other all of which define a pathway in the Z direction through the elongated tube.

4. The hybrid electrostatic lens of claim 3 wherein the first, third, sixth and eighth electrodes have the same voltage bias.

5. The hybrid electrostatic lens of claim 3 wherein the second, fourth, fifth and seventh electrodes have the same voltage bias.

6. The hybrid electrostatic lens of claim 1 wherein the first electrode includes an aperture through which the ion beam enters the hybrid electrostatic lens.

7. The hybrid electrostatic lens of claim 1 wherein the second electrode includes an aperture through which the ion beam exits the hybrid electrostatic lens.

8. The hybrid electrostatic lens of claim 1 wherein the elongated tube has a longitudinal axis in the z direction from the first end to the second end.

9. The hybrid electrostatic lens of claim 1 wherein the first and second electrodes are maintained at ground potential and the elongated tube is biased with a voltage potential opposite to the charge of ions comprising the ion beam to generate an electric field in a path of the ion beam as it travels through the hybrid electrostatic lens in the Z direction.

10. The hybrid electrostatic lens of claim 2 wherein an electric field is applied to the ion beam at the first stage which stretches the ion beam in the X direction as it travels through the hybrid electrostatic lens in the Z direction.

11. The hybrid electrostatic lens of claim 10 wherein an electric field is applied to the ion beam at the second stage which squeezes the ion beam in the Y direction as it travels through the hybrid electrostatic lens in the Z direction.

12. The hybrid electrostatic lens of claim 11 wherein an electric field is applied to the ion beam at the second stage which squeezes the ion beam in the X direction as it travels through the hybrid electrostatic lens in the Z direction.

13. The hybrid electrostatic lens of claim 12 wherein an electric field is applied to the ion beam at the second stage which stretches the ion beam in the Y direction as it travels through the hybrid electrostatic lens in the Z direction.

14. An ion implantation system comprising:
    an ion source operable to generate an ion beam;
    a mass analyzer configured to receive the ion beam from the ion source and allow ions within ion beam having a desired mass and charge to pass through the mass analyzer along a predetermined path;
    a hybrid electrostatic lens configured to receive the ion beam from the mass analyzer, shape the ion beam, and focus the ion beam for transmission therethrough; wherein the electrostatic lens is a quadrupole lens having a first stage defined by four quadrupole lenses turned 90° with respect to each other to define a pathway in the Z direction through the elongated tube; and
    an end station downstream of the mass analyzer configured to support a workpiece for implantation thereof via the ribbon beam.

15. The ion implantation system of claim 14 further comprising a tandem accelerator disposed between the hybrid electrostatic lens and the end station, the tandem accelerator configured to receive the ion beam from the hybrid electrostatic lens and accelerate ions associated with the ion beam to desired energy.

16. The ion implantation system of claim 14 wherein the hybrid electrostatic comprises:
    an Einzel lens defined by an elongated tube having a first and second ends, a first electrode disposed at the first end and a second electrode disposed at the second end, the elongated tube being configured to receive a voltage bias to generate an electric field for focusing the beam therein; and
    a quadrupole lens having a first stage defined by a electrodes turned 90° with respect to each other and a second stage defined by electrodes turned 90° with respect to each other, the first and second stages defining a pathway through the elongated tube along through which the ion beam travels.

17. The hybrid electrostatic lens of claim 16 wherein the first electrode includes an aperture through which the ion beam enters the hybrid electrostatic lens from the mass analyzer, and the second electrode includes an aperture through which the ion beam exits the hybrid electrostatic lens.

18. The hybrid electrostatic lens of claim 16 wherein the first stage comprises a first, second, third and fourth electrodes turned 90° with respect to each other and the second stage comprises a fifth, sixth, seventh and eighth electrodes turned 90° with respect to each other all of which define a pathway in the for the ion beam through the elongated tube.

19. The hybrid electrostatic lens of claim 16 wherein the first and second electrodes are maintained at ground potential and the elongated tube is biased with a voltage potential opposite to the charge of ions comprising the ion beam to generate an electric field in the pathway of the ion beam as it travels through the hybrid electrostatic lens.

* * * * *

UNITED STATES PATENT AND TRADEMARK OFFICE
CERTIFICATE OF CORRECTION

| | | |
|---|---|---|
| PATENT NO. | : 8,664,619 B2 | Page 1 of 3 |
| APPLICATION NO. | : 13/801713 | |
| DATED | : March 4, 2014 | |
| INVENTOR(S) | : Shengwu Chang | |

It is certified that error appears in the above-identified patent and that said Letters Patent is hereby corrected as shown below:

Delete Title Page with illustrative Figure, and replace with new Title Page with illustrative Figure. (Attached)

In the Drawings

Delete Drawing 1 of 6, and replace with new Drawing Sheet 1 of 6. (Attached)

Signed and Sealed this
Twenty-seventh Day of January, 2015

Michelle K. Lee
*Deputy Director of the United States Patent and Trademark Office*

(12) United States Patent
Chang

(10) Patent No.: US 8,664,619 B2
(45) Date of Patent: Mar. 4, 2014

(54) HYBRID ELECTROSTATIC LENS FOR IMPROVED BEAM TRANSMISSION

(71) Applicant: Varian Semiconductor Equipment Associates, Inc., Gloucester, MA (US)

(72) Inventor: Shengwu Chang, South Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/801,713

(22) Filed: Mar. 13, 2013

(65) Prior Publication Data
US 2013/0256526 A1    Oct. 3, 2013

Related U.S. Application Data

(60) Provisional application No. 61/617,738, filed on Mar. 30, 2012.

(51) Int. Cl.
| | | |
|---|---|---|
| *H01J 3/18* | (2006.01) | |
| *H01J 37/12* | (2006.01) | |
| *H01J 49/06* | (2006.01) | |

(52) U.S. Cl.
USPC .............. 250/396 R; 250/492.21; 250/492.3; 250/295; 313/361.1

(58) Field of Classification Search
USPC .................... 250/396 R, 492.21, 492.3, 295; 313/361.1
See application file for complete search history.

(56) References Cited

U.S. PATENT DOCUMENTS

| | | | |
|---|---|---|---|
| 5,036,258 A | 7/1991 | Chen et al. | |
| 2010/0084576 A1* | 4/2010 | Vanderberg | 250/492.3 |
| 2011/0079731 A1 | 4/2011 | Kim | |
| 2012/0223244 A1* | 9/2012 | Welkie | 250/396 ML |
| 2013/0256527 A1* | 10/2013 | Chang | 250/295 |

FOREIGN PATENT DOCUMENTS

WO    2001/060133 A1    8/2001

OTHER PUBLICATIONS

Oh, et al., "Optimization of electrostatic lens systems for low-energy scanning microcolumn applications," J. Vacuum Science and Technology, Part A, vol. 26, No. 6, Oct. 30, 2008.
International Search Report, dated May 7, 2013 for corresponding International Patent Application No. PCT/US2013/031755.

* cited by examiner

*Primary Examiner* — Nikita Wells

(57) ABSTRACT

A hybrid electrostatic lens is used to shape and focus an ion beam. The hybrid electrostatic lens comprises an Einzel lens defined by an elongated tube having a first and second ends and a first electrode disposed at the first end and a second electrode disposed at the second end. The elongated tube is configured to receive a voltage bias to create an electric field within the Einzel lens as the ion beam travels through the hybrid electrostatic lens. The hybrid electrostatic lens further includes a quadrupole lens having a first stage and a second stage, where each of the stages is defined by a plurality of electrodes turned 90° with respect to each other to define a pathway in the Z direction through the elongated tube. The Einzel lens focuses the ion beam and the quadrupole lens shapes the ion beam.

19 Claims, 6 Drawing Sheets